(12) United States Patent
Schulze et al.

(10) Patent No.: US 8,809,971 B2
(45) Date of Patent: Aug. 19, 2014

(54) SEMICONDUCTOR COMPONENT

(75) Inventors: Hans-Joachim Schulze, Taufkirchen (DE); Frank Pfirsch, Munich (DE)

(73) Assignee: Infineon Technologies Austria AG, Villach (AT)

( * ) Notice: Subject to any disclaimer, the term of this patent is extended or adjusted under 35 U.S.C. 154(b) by 622 days.

(21) Appl. No.: 12/861,153

(22) Filed: Aug. 23, 2010

(65) Prior Publication Data

US 2011/0049593 A1    Mar. 3, 2011

(30) Foreign Application Priority Data

Aug. 25, 2009   (DE) .......................... 10 2009 038 710

(51) Int. Cl.
*H01L 29/78*   (2006.01)

(52) U.S. Cl.
USPC ................... 257/411; 257/406; 257/E29.164; 257/E29.165; 257/E21.436

(58) Field of Classification Search
USPC ........................................................ 257/406
See application file for complete search history.

(56) References Cited

U.S. PATENT DOCUMENTS

| | | | | |
|---|---|---|---|---|
| 5,572,052 A | * | 11/1996 | Kashihara et al. | 257/295 |
| 5,619,051 A | * | 4/1997 | Endo | 257/316 |
| 6,057,584 A | * | 5/2000 | Gardner et al. | 257/411 |
| 6,306,742 B1 | * | 10/2001 | Doyle et al. | 438/591 |
| 6,501,121 B1 | * | 12/2002 | Yu et al. | 257/310 |
| 7,005,697 B2 | * | 2/2006 | Batra et al. | 257/315 |
| 7,145,201 B2 | | 12/2006 | Pfirsch | |
| 7,268,388 B2 | * | 9/2007 | Basceri et al. | 257/324 |
| 7,342,276 B2 | * | 3/2008 | Ooms et al. | 257/312 |
| 7,462,538 B2 | | 12/2008 | Li et al. | |
| 7,755,144 B2 | | 7/2010 | Li et al. | |
| 2005/0023622 A1 | * | 2/2005 | Eisenbeiser et al. | 257/410 |
| 2005/0035401 A1 | * | 2/2005 | Yamaguchi et al. | 257/330 |
| 2005/0194635 A1 | | 9/2005 | Pfirsch | |
| 2010/0129968 A1 | | 5/2010 | Li et al. | |

FOREIGN PATENT DOCUMENTS

| | | |
|---|---|---|
| DE | 10355669 A1 | 6/2005 |
| DE | 10361714 A1 | 8/2005 |
| DE | 102006003059 T5 | 10/2008 |

OTHER PUBLICATIONS

Kittel, "Einführung in die Festkörperphysik", 14 Plasmonen, Polaritonen und Polaronen, pp. 436-439, 2006, Oldenbourg Wissenschaftsverlage GmbH.

Bunget, "Physics of Solid Dielectrics", Materials Science Monographs 19, pp. 338-339, 1978, Editura Stiintifica si Enciclopedica.

Office Action issued Sep. 10, 2009 in corresponding German Application No. 10 2009 038 710.2.

* cited by examiner

*Primary Examiner* — Matthew W Such
*Assistant Examiner* — Abul Kalam
(74) *Attorney, Agent, or Firm* — Murphy, Bilak & Homiller, PLLC

(57) ABSTRACT

A semiconductor component comprising a semiconductor body, a channel zone in the semiconductor body, a channel control electrode adjacent to the channel zone, and a dielectric layer between the channel zone and the channel control electrode, wherein the dielectric layer has a relative dielectric constant $\epsilon_r$ with a negative temperature coefficient.

17 Claims, 4 Drawing Sheets

SEMICONDUCTOR COMPONENT

PRIORITY CLAIM

This application claims priority from German Patent Application No. 10 2009 038 710.2, which was filed on 25 Aug. 2009, and is incorporated herein by reference in its entirety.

FIELD OF THE INVENTION

Embodiments of the present invention relate to a semiconductor component with a channel zone.

BACKGROUND

During operation, semiconductor components are heated because of high current densities with a high voltage at the same time. Such heating can either be comparatively homogeneous, or locally restricted, because of current filamentation.

When semiconductor components are operated below the so-called stable-temperature point, current filamentation may occur at a sufficiently high voltage, and can lead to destruction of the semiconductor component.

Therefore in order to prevent excessive heating and current filamentation, the electrical parameters such as the forward current, dI/dt, dU/dt, temperature etc. are generally limited appropriately, in order not to exceed the safe range (SOA range) during operation. On the one hand, this restricts the possible improvement of the semiconductor component characteristics, and on the other hand, the options for use of the semiconductor components are limited, particularly when disturbances are taken into account which require the semiconductor components to be more robust.

One possibility to protect semiconductor components against excessive heating is to install one or more temperature sensors in the semiconductor component and to regulate the gate voltage of the semiconductor component down to a lower value, beyond a specific threshold temperature, on the basis of the measurement results from the temperature sensors. However, this results in increased complexity both in the semiconductor component and for the temperature evaluation and the regulation of the gate voltage. Further, a certain delay time in the temperature signal must be expected, because of the physical distance between the temperature source and the temperature sensor.

SUMMARY

One embodiment relates to a semiconductor component which has a semiconductor body, a channel zone in the semiconductor body, a channel control electrode adjacent to the channel zone, and a dielectric layer between the channel zone and the channel control electrode, wherein the dielectric layer has a relative dielectric constant $\in_r$ with a negative temperature coefficient.

Since the dielectric constant also governs the current flowing in the channel zone, the current in the channel zone may be reduced as a consequence of the negative temperature coefficient of the dielectric constant $\in_r$ when there is a risk of excessive current filamentation of the component as a consequence of a current-dependent temperature increase. A negative temperature coefficient of the dielectric constant means that the dielectric constant decreases as the temperature rises. However, a decrease in the dielectric constant when the temperature rises means that the channel—which is formed when the gate voltage on the channel control electrode remains constant—is weaker in the channel zone and has a higher resistance, and the current through the channel is therefore reduced, with the source-drain voltage remaining constant. This makes it possible to counteract a current-dependent temperature rise in the semiconductor component.

The dielectric layer may include a paraelectric substance, at least partially.

The paraelectric substance may be a substance from the group of $Ba_xSr_{1-x}TiO_3$ and/or $KTaO_3$. A further embodiment is for the dielectric layer to have a ferroelectric substance. The Curie temperature $T_c$ of the ferroelectric substance is e.g.: $T_c<220$ K. The Curie temperature should be below the temperature range in which the components are used (for example between 220 K and 550 K) since, otherwise, undesirable effects could occur in the event of a transition to the ferroelectric state, such as the channel being switched on without a positive gate voltage.

One embodiment provides for the dielectric layer to be composed of a layer stack with at least two sublayers composed of dielectric material. By way of example, the temperature dependency of the capacitance may also be accurately adjusted via the thickness ratio and the temperature dependency of the dielectric constants of these sublayers, thus allowing a wide range of use. At least one sublayer may be composed of $SiO_2$. Furthermore, the $SiO_2$ sublayer may be located adjacent to the channel zone for example in order, to avoid undesirable interface effects. It is advantageous for a center sublayer to be arranged between two outer sublayers. In this case, the center sublayer may be an electrically conductive layer. This has the advantage, for example, that it is possible to prevent charging on the interface between the two outer sublayers. For this purpose, for example, the center sublayer may be composed of a metal, a silicide or a polysilicon. It is also advantageous for the outer sublayers to be composed of dielectric material. At least one sublayer may be formed using a dielectric material whose relative dielectric constant $\in_r$ has a negative temperature coefficient.

According to one embodiment, the channel zone is doped with a first conduction type and is in each case arranged with doping of a second conduction type between a first semiconductor zone in the semiconductor body and a second semiconductor zone in the semiconductor body.

The channel zone can be part of a MOSFET, of an IGBT or of an EST (Emitter Switched Thyristor).

According to one exemplary embodiment, the dielectric layer is arranged on a main surface of the semiconductor body along the channel zone and the channel control electrode is arranged on a surface of the dielectric layer, opposite the main surface, at least along the channel zone. Alternatively, a trench is formed in the semiconductor body, the dielectric layer is arranged at least on the side walls of the trench along the channel zone and the channel control electrode is arranged on the dielectric layer in the trench at least along the channel zone.

According to a further embodiment, the dielectric layer has a relative dielectric constant $\in_r$ at a temperature of 500 K which is at least 20% less than the relative dielectric constant $\in_r$ of the dielectric layer at a temperature of 300 K.

In a further exemplary embodiment, the dielectric layer has a thickness in the range from $\in_r \times 2$ nm to $\in_r \times 50$ nm where $\in_r$ is the dielectric constant of the dielectric layer at a temperature of 300 K.

The relative dielectric constant $\in_r$ of the dielectric layer may have a negative temperature coefficient in a first temperature range, and a positive temperature coefficient in a second temperature range.

Further, the relative dielectric constant $\epsilon_r$ of the dielectric layer may have a negative temperature coefficient at least in a first temperature range between 220 K and 500 K.

Those skilled in the art will recognize additional features and advantages upon reading the following detailed description, and upon viewing the accompanying drawings.

DETAILED DESCRIPTION

Figure 1:
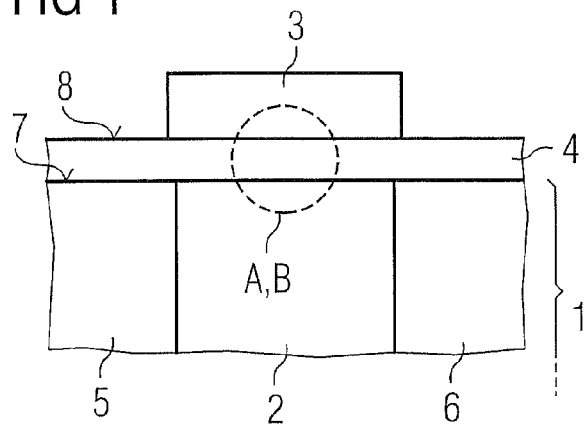
FIG. 1 schematically shows a cross-sectional view of a semiconductor component with a channel zone, a channel control electrode and a dielectric layer arranged between them.

Exemplary embodiments of the invention will be explained in more detail in the following text with reference to the attached drawings. However, the invention is not restricted to the specifically described embodiments, but can be modified and amended in a suitable manner. It is within the scope of the invention for individual features and feature combinations of one embodiment to be combined suitably with features and feature combinations of another embodiment, in order to arrive at further embodiments according to the invention.

Before explaining the exemplary embodiments of the present invention in more detail, it should be noted that the same elements in the figures are provided with the same or similar reference characters, and that these elements will not be described repeatedly. Furthermore, the drawings are not necessarily to scale. The major aspect is in fact to explain the basic principle.

FIG. 1 schematically illustrates a cross sectional view of a semiconductor component. The semiconductor component has a semiconductor body 1, a channel zone 2 in the semiconductor body, a channel control electrode 3 adjacent to the channel control zone 2, and a dielectric layer 4 between the channel zone 2 and the channel control electrode 3. The dielectric layer 4 has a relative dielectric constant $\epsilon_r$ with a negative temperature coefficient at least in the region of the operating temperatures of the semiconductor component, which are typically in the range from 220 K to 500 K. The temperature coefficient may also vary in different temperature ranges, for example the dielectric constant may have a negative temperature coefficient in a first temperature range and a positive coefficient in a second temperature range.

As shown in the example of FIG. 1, the channel zone 2 may be arranged between a first semiconductor zone 5 in the semiconductor body 1 and a second semiconductor zone 6 in the semiconductor body 1. In this case, the first semiconductor zone 5 and the second semiconductor zone 6 normally form the source and drain of a MOSFET. The first semiconductor zone 5 and the second semiconductor zone 6 are, for example, doped with a second conduction type, while the channel zone 2 is generally doped with a first conduction type, which is complementary to the second conduction type.

The channel zone 2 is normally part of a MOSFET, an IGBT (Insulated Gate Bipolar Transistor) or an EST (Emitter Switched Thyristor).

As shown illustratively in FIG. 1, the dielectric layer 4 can be arranged on a main surface 7 of the semiconductor body 1 along the channel zone (Gate) 2, and the channel control electrode (Gate electrode) 3 can be applied on a surface 8, which is opposite the main surface 7, of the dielectric layer 4, at least along the channel zone 2.

Alternatively, a trench (not illustrated) may also be formed in the semiconductor body 1, the dielectric layer 4 may be arranged at least on the side walls of the trench along the channel zone (Gate) 2, and the channel control electrode (Gate electrode) 3 may be attached to the dielectric layer 4 in the trench at least along the channel zone 2.

Independent of the semiconductor component type (MOSFET, IGBT, EST, planar, trench etc.), the dielectric layer 4 has a relative dielectric constant $\epsilon_r$ with a negative temperature coefficient at least in the operating temperature range of the semiconductor component to achieve the desired effect of a local current reduction in the area of the semiconductor component at a raised temperature. A dielectric constant $\epsilon_r$ with a negative temperature coefficient means that the dielectric constant decreases when the temperature rises, while a dielectric constant $\epsilon_r$ with a positive temperature coefficient means that the dielectric constant increases when the temperature rises. Since the dielectric constant also governs the capacitance between the channel zone 2 and the channel control electrode 3, and therefore also the inversion channel which is formed, for example, in the channel zone 2, this results in the desired effect that the current in the inversion channel is reduced when the temperature rises locally in the semiconductor component, for example because of current filamentation, whereas the dielectric constant falls in this area.

This makes it possible to prevent or limit further self-induced heating of the semiconductor component as a result of joule losses.

The following equation defines the relationship for the current flowing in the inversion channel:
 a) for the linear range (that is $V_D \ll (V_G - V_T)$): $I \sim C\,(V_G - V_T) \times V_D$
 b) for the saturation range (for example in case of a short circuit): $I \sim C\,(V_G - V_T)^2$ C represents the capacitance of the insulator, $V_G$ the gate voltage, $V_T$ the channel threshold voltage and $V_D$ the drain voltage. The threshold voltage rises as the capacitance decreases. Since $C \sim \epsilon$, the desired effect of local current reduction in heated areas is achieved, if the dielectric constant $\epsilon$ decreases considerably with temperature. For example, this is the case in paraelectric substances for which: $\epsilon_r \sim 1/T$.

Thus, a dielectric layer 4 which at least partially includes a parasitic substance may be applied between the channel zone 2 and the channel control electrode 3.

In particular, the paraelectric substance has a substance selected from the group of $Ba_xSr_{1-x}TiO_3$ and/or $KTaO_3$.

Likewise, ferroelectrics are suitable for use as dielectric layer 4, where $\epsilon_r \sim C/(T-T_c)$, and where $T_c$ is the Curie temperature. This is particularly true when the operating temperatures of the semiconductor component are above $T_c$. The Curie temperature $T_c$ should be below the operating temperature range of the semiconductor component, otherwise, a transition into the ferroelectric state may cause undesirable effects, such as the channel being switched on without a positive gate voltage.

The dielectric layer 4 may therefore include a ferroelectric substance for which particularly the Curie temperature $T_c$ of the ferroelectric substance is given by: $T_c < 220$ K. There are ferroelectrics whose Curie temperature is, for example, below 150 K. In the case of $SrTiO_3$, the Curie temperature $T_c$ merely approximates 0 K. If the Curie temperature is 0 K, the dielectric constant $\in_r$ and, therefore, the channel conductivity decrease by 40% when there is a temperature increase by $\Delta T=200$ K from 300 K to 500 K, and even decreases by 67% for the same temperature difference, when $T_c=200$ K.

The dielectric layer should have a relative dielectric constant $\in_r$ at a temperature of 500 K which is at least 20% less than the relative dielectric constant $\in_r$ of the dielectric layer at a temperature of 300 K.

The thickness of the dielectric layer is, for example, in the range of from $\in_r \times 2$ nm to $\in_r \times 50$ nm, where $\in_r$ is the relative dielectric constant of the dielectric layer at a temperature of 300 K.

Figure 2:
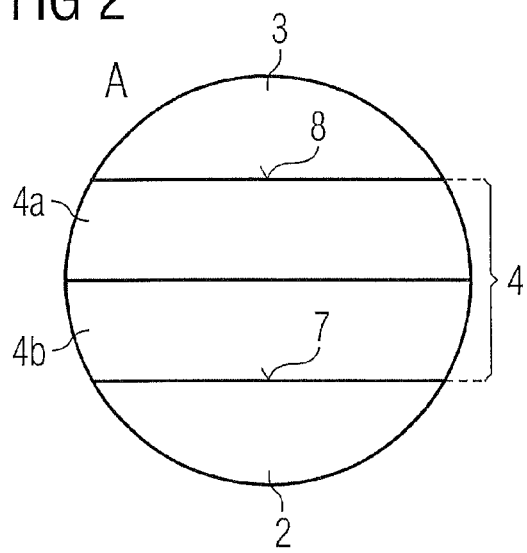
FIG. 2 shows an enlarged detail of one exemplary embodiment of the semiconductor component shown in FIG. 1.

FIG. 2 shows an enlarged detail of an area A in FIG. 1, depicting one exemplary embodiment of the dielectric layer 4. In this example, the dielectric layer 4 is composed of a layer stack with at least two sublayers 4a, 4b made of dielectric material. In this case, only one of these at least two sublayers 4a, 4b may additionally have a relative dielectric constant $\in_r$ with a negative temperature coefficient. The characteristics already mentioned with respect to FIG. 1 for the dielectric layer having a relative dielectric constant $\in_r$ with a negative temperature coefficient, are then also valid for this sublayer. However, a plurality of sublayers 4a may also have a dielectric constant $\in_r$ with negative temperature coefficients in each case. At least one other sublayer may be composed of $SiO_2$. An $SiO_2$ sublayer 4b may be located adjacently to the channel zone 2.

Figure 3:
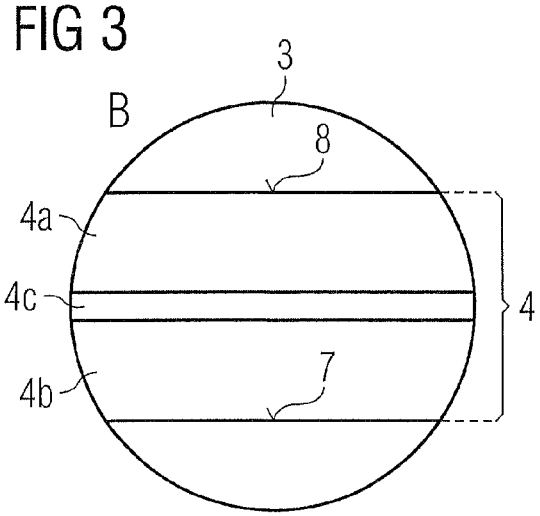
FIG. 3 shows an enlarged detail of one exemplary embodiment of the semiconductor component shown in FIG. 1.

FIG. 3 shows an enlarged detail of an area B in FIG. 1 depicting a different exemplary embodiment of the dielectric layer 4. In said exemplary embodiment, likewise the dielectric layer 4 is composed of a plurality of sublayers 4a, 4b, 4c, with a center sublayer 4c being arranged between two outer sublayers 4a, 4b. In this case, the center sublayer 4c may be an electrically conductive layer, for example composed of metal, silicide or polysilicon. Particularly if the outer sublayers 4a, 4b are composed of dielectric material, with at least one of these outer sublayers 4a, 4b having a dielectric constant $\in_r$, as already described hereinbefore, with $\in_r$ having a negative temperature coefficient, the electrically conductive center sublayer 4c may prevent interface charges which may occur between the outer sublayers 4a, 4b. Particularly this is valid, if one outer sublayer 4a comprises a different dielectric than the other outer sublayer 4b. This may cause charging at the interface of the two dielectrics, particularly when the temperatures are relatively high in the on-state. This may even result in the semiconductor component to be switched on at a gate voltage of 0 volts. For example, this may be caused by extremely different electrical conductivities of the dielectrics used in the outer sublayers 4a, 4b. Inserting an electrically conductive center sublayer 4c between the outer sublayers 4a, 4b and suitable wiring can prevent such interface charging.

The wiring of the electrically conductive center sublayer 4c may be implemented, for example, via a voltage divider, in which case the voltage divider is connected between the semiconductor body 1 and the channel control electrode 3 and the electrically conductive center sublayer 4c is connected only to this voltage divider.

Figure 4:
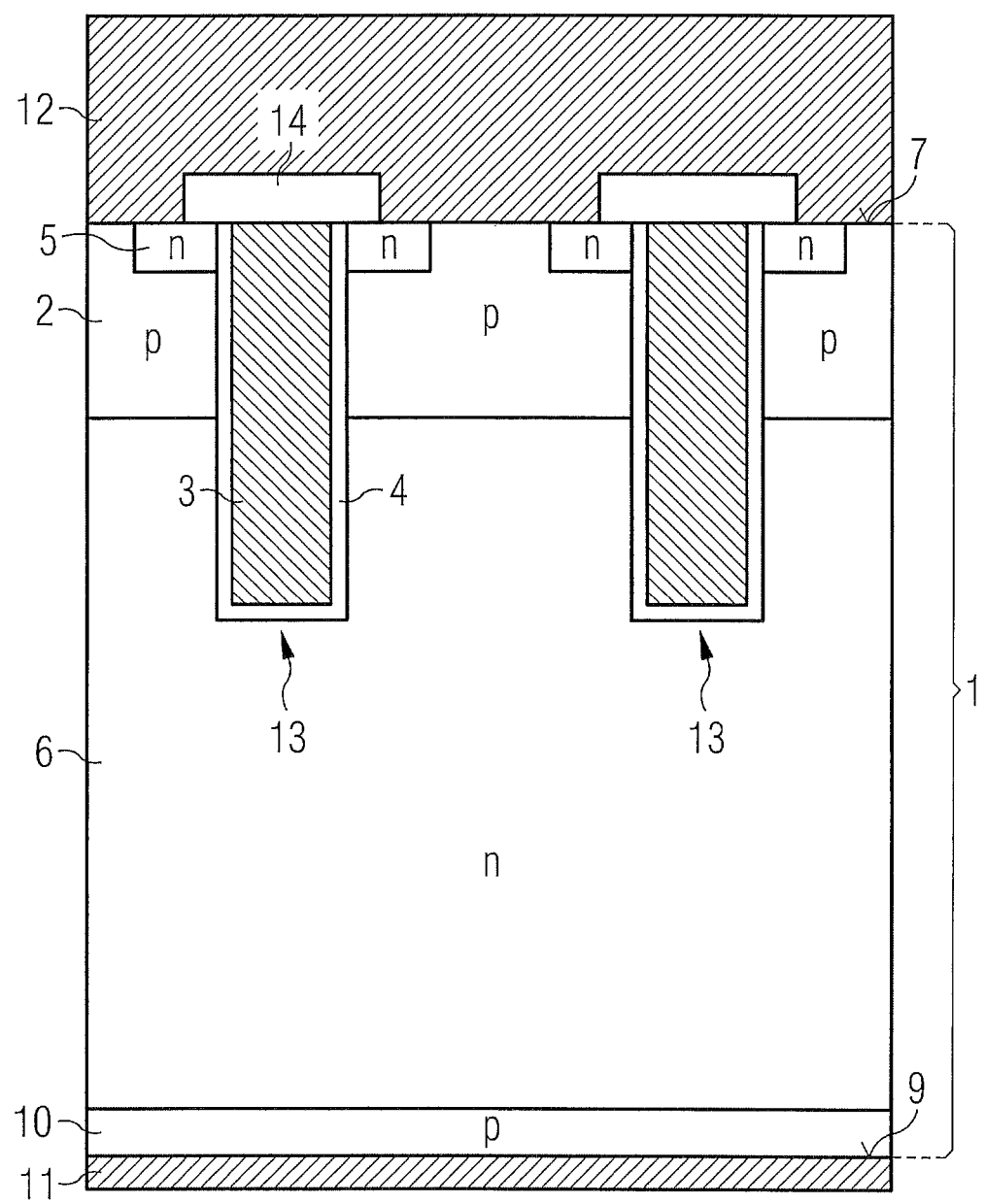
FIG. 4 schematically shows a cross-sectional view of one exemplary embodiment of an IGBT with a trench gate.

FIG. 4 shows a schematic cross-sectional view of one embodiment of the invention in an exemplary semiconductor component, an IGBT in particular. Between a first surface 7 and a second surface 9 of an IGBT semiconductor body 3, consecutive semiconductor zones are formed. An n-doped semiconductor zone 5 (source) is formed directly adjacent to the first surface 7 of the semiconductor body 1. A p-doped channel zone 2 is formed adjacent to said n-doped semiconductor zone 5. A further n-doped semiconductor zone 6 (drift zone) is located adjacently to said channel zone 2, in the direction of the second surface 9. A further p-doped semiconductor zone 10 (emitter zone) is formed adjacently to this semiconductor zone 6 and extends to the second surface 9 of the semiconductor body. A rear-face contact material 11, generally a metal, is applied to the second surface 9. The doping of the individual semiconductor zones could also be complementarily to the doping types mentioned hereinbefore.

A contact material 12 contacting both, the source zone 5 and the channel zone 2 which extends the surface 7, is arranged on the first surface 7 of the semiconductor body 1.

Starting from the surface 7 of the semiconductor body 1, a trench 13 extends into the semiconductor body 1, through the channel zone 2 as far as the drift zone 6. The walls of the trench 13 are in this case lined with the dielectric layer 4 according to the invention. The dielectric layer 4 is located at least between the channel zone 2 and a channel control electrode 3, which is likewise formed on the dielectric layer 4 in the trench 13. In this case, the channel control electrode 3 extends at least along the channel zone 2 in the trench 13. The channel control electrode 3 is isolated from the contact material 12 by an insulating material 14.

Figure 5:
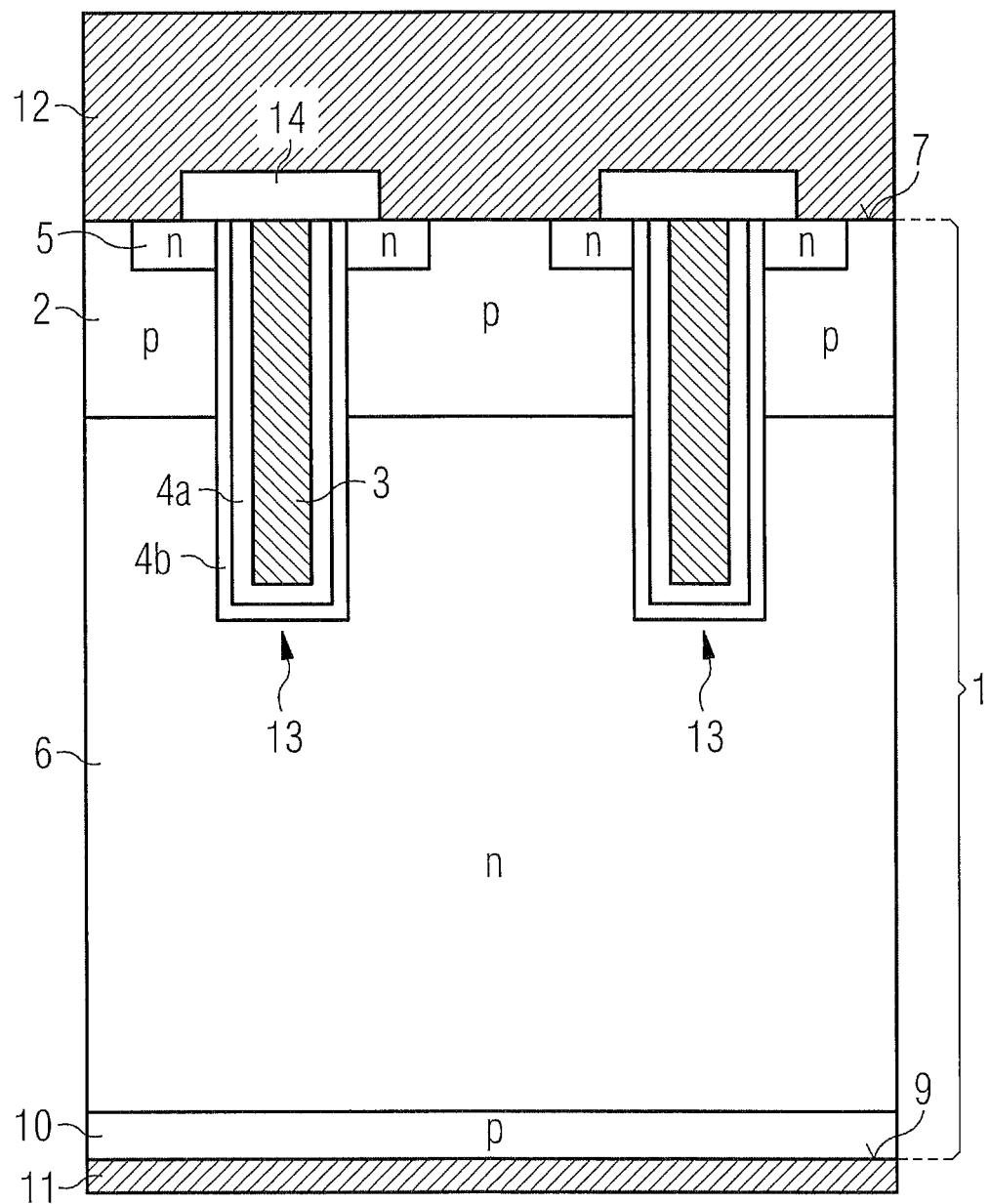
FIG. 5 schematically shows a cross-sectional view of a further exemplary embodiment of an IGBT with a trench gate.

FIG. 5 shows a schematic cross-sectional view of another exemplary embodiment of the invention, using the example of an IGBT. Contrary to the exemplary embodiment shown in FIG. 4, the dielectric layer 4 is composed, for example, of two sublayers 4a and 4b (as already described, illustratively, with reference to FIG. 2).

In a further embodiment, which is not illustrated, the dielectric layer 4 may also be deposited completely only along the channel zone. Said embodiment is given, if, e.g., one of the two or one of the plurality of sublayers is deposited only in a section along the channel zone and, for example, on the first sublayer already deposited along the complete channel zone, the first sublayer including, e.g., $SiO_2$.

Figure 6:
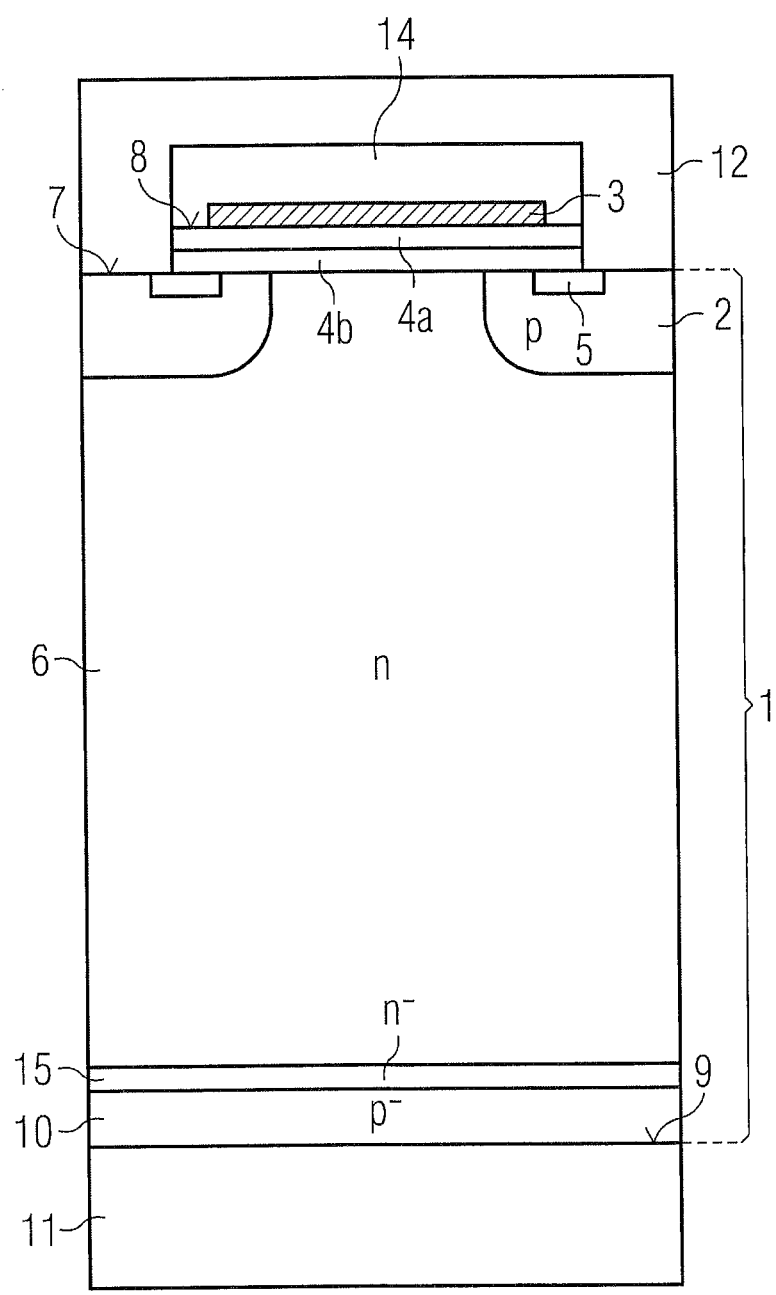
FIG. 6 schematically shows a cross-sectional view of one exemplary embodiment of a planar IGBT.

FIG. 6 shows a schematic cross-sectional view of one exemplary embodiment of the invention with two sublayers 4a, 4b of the dielectric layer 4. The exemplary embodiment likewise shows an IGBT, although this has no trench. In this case, the channel control electrode 3 is located adjacently to the channel zone 2 on top of the first surface 7 of the semiconductor body 1 (in its planar form), in which case the dielectric layer 4, for example in the form of two sublayers 4a, 4b, is located between the channel zone 2 and the channel control electrode 3 on the first surface 7 of the semiconductor body 1.

In the exemplary embodiment, which relates to an IGBT, an n-doped field stop layer 15 is located in the drift zone 6. In the embodiment shown in FIG. 6, the field stop layer 15 is adjacent to the emitter zone 10 of the IGBT.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A semiconductor component comprising:
   a semiconductor body;
   a channel zone in the semiconductor body;
   a channel control electrode adjacent to the channel zone;
   a dielectric layer between the channel zone and the channel control electrode;
   wherein the dielectric layer comprises a layer stack with at least two sublayers composed of dielectric material and wherein the dielectric layer has a relative dielectric constant $\in_r$ with a negative temperature coefficient, and wherein the dielectric layer has a thickness ranging from $\in_r*2$ nm to $\in_r*50$ nm, where $\in_r$ is the relative dielectric constant of the dielectric layer at a temperature of 300 K;
   wherein at least one sublayer is composed of $SiO_2$; and
   wherein at least one sublayer comprises a dielectric material with a relative dielectric constant $\in_r$ having a negative temperature coefficient.

2. The semiconductor component according to claim 1, wherein the dielectric layer at least partially comprises a paraelectric substance.

3. The semiconductor component according to claim 2, wherein the paraelectric substance comprises at least one of $Ba_xSr_{1-x}TiO_3$ and $KTaO_3$.

4. The semiconductor component according to claim 1, wherein the dielectric layer comprises a ferroelectric substance.

5. The semiconductor component according to claim 4, wherein the Curie temperature Tc of the ferroelectric substance is: Tc<220 K.

6. The semiconductor component according to claim 1, wherein the $SiO_2$ sublayer is located adjacent the channel zone.

7. The semiconductor component according to claim 1, wherein the channel zone has a first conduction type doping, and wherein the channel zone is arranged between a first semiconductor zone in the semiconductor body and a second semiconductor zone in the semiconductor body, the first and the second semiconductor zones each having a second conduction type doping.

8. The semiconductor component according to claim 1, wherein the channel zone is part of a MOSFET, an IGBT or an EST.

9. The semiconductor component according to claim 1, wherein the dielectric layer is arranged on a main surface of the semiconductor body along the channel zone and wherein the channel control electrode is attached to a surface of the dielectric layer opposite to the main surface, at least along the channel zone.

10. The semiconductor component according to claim 1, wherein a trench is formed in the semiconductor body, wherein the dielectric layer is arranged at least on the side walls of the trench along the channel zone, and wherein the channel control electrode is arranged in the trench on the dielectric layer at least along the channel zone.

11. The semiconductor component according to claim 1, wherein a center sublayer is arranged between two outer sublayers.

12. The semiconductor component according to claim 11, wherein the center sublayer is an electrically conductive layer.

13. The semiconductor component according to claim 12, wherein the center sublayer is composed of a metal, a silicide or a polysilicon.

14. The semiconductor component according to claim 11, wherein the outer sublayers are composed of dielectric material.

15. The semiconductor component according to claim 1, wherein the dielectric layer has a relative dielectric constant $\in_r$ which is at least 20% less at a temperature of 500 K than the relative dielectric constant $\in_r$ of the dielectric layer at a temperature of 300 K.

16. The semiconductor component according to claim 1, wherein the relative dielectric constant $\in_r$ of the dielectric layer has a negative temperature coefficient in a first temperature range, and a positive temperature coefficient in a second temperature range.

17. The semiconductor component according to claim 1, wherein the relative dielectric constant $\in_r$ of the dielectric layer has a negative temperature coefficient at least in a first temperature range between 220 K and 500 K.

* * * * *